United States Patent
Harvey

(10) Patent No.: US 7,224,164 B2
(45) Date of Patent: May 29, 2007

(54) METHOD OF MONITORING A MAGNETIC FIELD DRIFT OF A MAGNETIC RESONANCE IMAGING APPARATUS

(75) Inventor: Paul Royston Harvey, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/564,049

(22) PCT Filed: Jul. 2, 2004

(86) PCT No.: PCT/IB2004/051102

§ 371 (c)(1),
(2), (4) Date: Jan. 9, 2006

(87) PCT Pub. No.: WO2005/003802

PCT Pub. Date: Jan. 13, 2005

(65) Prior Publication Data

US 2006/0164083 A1  Jul. 27, 2006

(30) Foreign Application Priority Data

Jul. 7, 2003  (EP)  .................................. 03102029

(51) Int. Cl.
  *G01V 3/00*  (2006.01)
(52) U.S. Cl. .................................................. 324/307
(58) Field of Classification Search ................. 324/307
See application file for complete search history.

(56) References Cited

U.S. PATENT DOCUMENTS 4,791,371 A  12/1988  Krol ........................... 324/318
4,885,542 A *  12/1989  Yao et al. .................... 324/313
5,151,656 A *  9/1992  Maier et al. ................. 324/309
5,423,315 A  6/1995  Margosian et al. ....... 128/653.2
5,636,636 A  6/1997  Kuhn et al. .............. 128/653.2

(Continued)

FOREIGN PATENT DOCUMENTS

EP  0 337 588 A2  10/1989

(Continued)

OTHER PUBLICATIONS

Zhao, X., et al.; $B_0$-Bluctuation-Induced Temporal Variation in EPI Image Series Due to the Disturbance of Steady-State Free Precession; 2000; MRM;44:758-765.

*Primary Examiner*—Diego Gutierrez
*Assistant Examiner*—Megann E Vaughn
(74) *Attorney, Agent, or Firm*—Fay, Sharpe, Fagan, Minnich & McKee LLP

(57) ABSTRACT

The invention enables to monitor a magnetic field drift of a magnetic resonance imaging apparatus on the basis of the magnetic resonance signals, which are acquired during magnetic resonance image data acquisition, such as by single shot EPI or by a gradient echo sequence. The phases of at least two magnetic resonance signals are acquired an echo time after the corresponding RF excitations. This corresponds to the central k-space line, which has frequency encoding but no phase encoding. The difference of two consecutive phase measurements, which are acquired at a certain time interval provides the shift of the resonance frequency. This enables monitoring of the shift of the resonance frequency and compensation of the magnetic field drift.

15 Claims, 4 Drawing Sheets

U.S. PATENT DOCUMENTS

| | | | |
|---|---|---|---|
| 5,652,514 A | 7/1997 | Zhang et al. | 324/307 |
| 5,914,601 A | 6/1999 | Goldfarb | 324/322 |
| 6,294,913 B1 | 9/2001 | Hinks et al. | 324/309 |
| 6,404,196 B1 | 6/2002 | Duerk et al. | 324/309 |
| 6,552,541 B2 | 4/2003 | Nauerth | 324/309 |
| 2001/0009369 A1 | 7/2001 | Shimo et al. | 324/307 |
| 2002/0048340 A1* | 4/2002 | Schaeffter et al. | 378/21 |
| 2005/0218894 A1* | 10/2005 | Miyawaki et al. | 324/309 |

FOREIGN PATENT DOCUMENTS

| | | |
|---|---|---|
| EP | 1 024 371 A2 | 8/2000 |
| EP | 1 143 258 A2 | 10/2001 |
| EP | 1 024 371 B1 | 12/2004 |
| JP | 1141656 | 6/1989 |
| WO | WO 00/54069 A1 | 9/2000 |

* cited by examiner

METHOD OF MONITORING A MAGNETIC FIELD DRIFT OF A MAGNETIC RESONANCE IMAGING APPARATUS

FIELD OF THE INVENTION

The present invention is related to the field of magnetic resonance imaging (MRI), and more particularly without limitation to magnetic field drift compensation.

BACKGROUND AND PRIOR ART

Prior art magnetic resonance imaging apparatus' generate a uniform magnetic field which is also referred to as the main field or the polarising field $B_0$. The purpose of the magnetic field is that the individual magnetic moments of the spins in the tissue to be visualised attempt to align with this polarising field, but precess about it in random order at a characteristic Larmor frequency which is determined by the gyromagnetic constant of the spins and the polarising magnetic field $B_0$.

However during operation of a magnetic resonance apparatus the magnetic field can vary over time due to various reasons. For example when the magnetic resonance apparatus is under heavy duty the passive iron shim pieces of the coils which generate the magnetic field heat up which leads to a fluctuation of the magnetic field.

U.S. Pat. No. 6,294,913b1 shows a method for compensation of variations in the polarising magnetic field during magnetic resonance imaging. Monitor signals are acquired in an interleaved manner during a scan with the MRI system. Frequency changes caused by variations in the polarising magnetic field $B_0$ are measured using the monitor signals, and these measured frequency changes are employed to compensate image data acquired during the scan. This compensation is achieved by changing the frequency of the RF transmitter and receiver to offset the effects of changes in $B_0$. A disadvantage of this compensation method is that special monitor signals are required for the compensation.

It is therefore an object of the present invention to provide for an improved method of monitoring and compensating a magnetic field drift.

SUMMARY OF THE INVENTION

The present invention provides for a method of monitoring a magnetic field drift of a magnetic resonance imaging apparatus which does not require special monitor signals or monitor sensors. Rather the method of the invention can be performed on the basis of the magnetic resonance signals which are acquired during magnetic resonance image data acquisition, such as by single shot EPI or by a gradient echo sequence.

In essence the phases of at least two magnetic resonance signals are acquired an echo time after the corresponding RF excitations. This corresponds to the central k-space line which has frequency encoding but no phase encoding. This central k-space is usually designated as $k_y=0$. The difference of two consecutive phase measurements which are acquired at a certain time interval provides the shift of the resonance frequency. This enables monitoring of the shift of the resonance frequency and compensation of the magnetic field drift.

In accordance with a further preferred embodiment of the invention a single shot EPI method is used for the magnetic resonance data acquisition. Single shot EPI has the advantage that every data acquisition contains the $k_y=0$ line such that for each data acquisition the required phase information can be obtained.

In accordance with a further preferred embodiment of the invention a gradient echo sequence is used for the magnetic resonance image data acquisition. During such a gradient echo sequence the k-space is scanned along an arbitrary trajectory which typically also contains the k-space line $k_y=0$. For example a full gradient echo sequence has 256 data acquisitions one of which is representative of $k_y=0$. The data acquisition for $k_y=0$ enables to obtain the required phase information once for each complete gradient echo sequence.

In accordance with a further preferred embodiment of the invention extra scans along $k_y=0$ are performed during a gradient echo sequence in order to obtain multiple phases during the complete sequence. This enables to monitor a magnetic field drift which occurs during a single gradient echo sequence.

BRIEF DESCRIPTION OF THE DRAWINGS

In the following preferred embodiments of the invention will be described in greater detail by making reference to the drawings in which.

DETAILED DESCRIPTION

Figure 1:
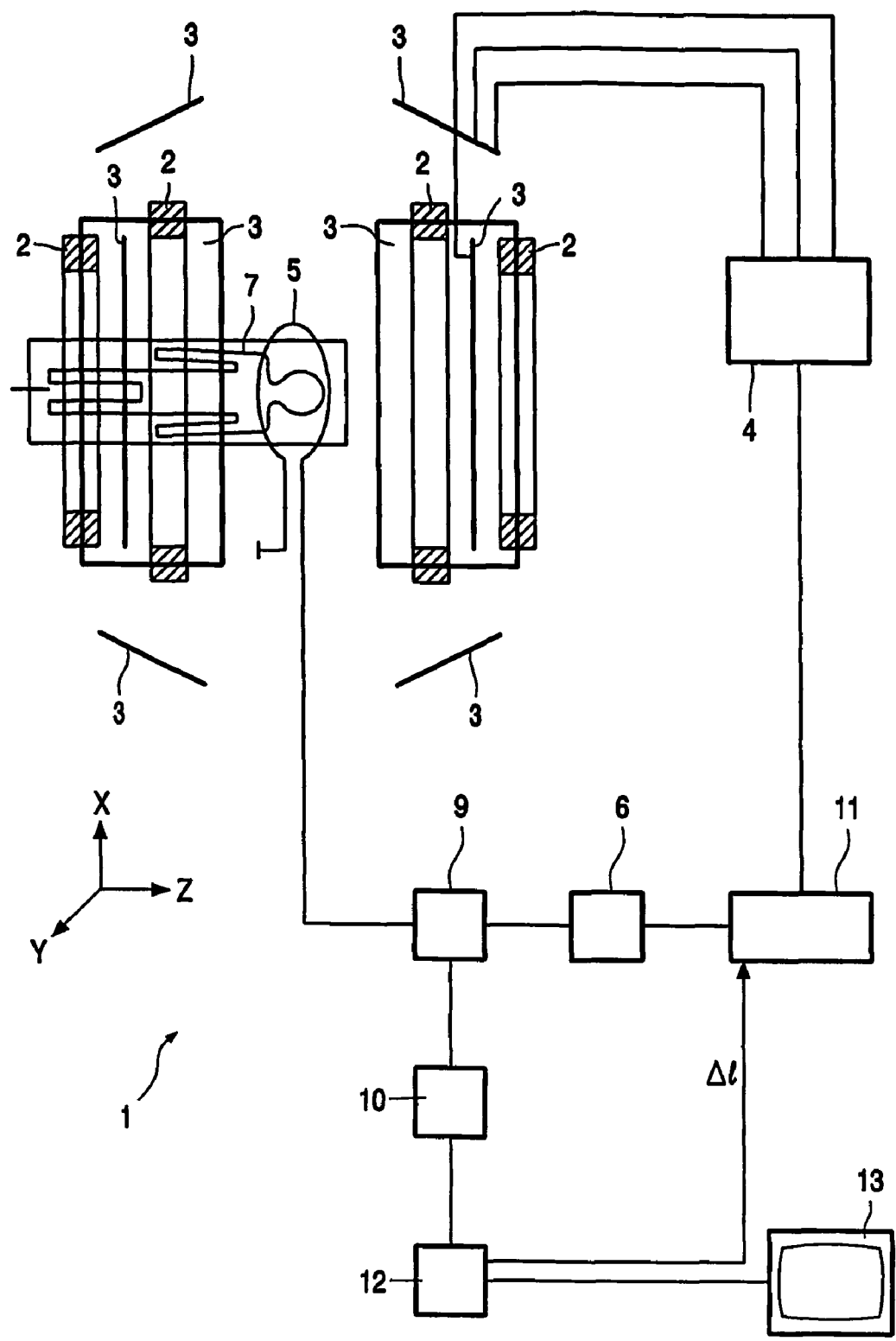
FIG. 1 shows a block diagram of a magnetic resonance apparatus with magnetic field drift compensation.

FIG. 1 shows a magnetic resonance device 1 which includes a first magnet system 2 for generating a steady magnetic field, and also several gradient coils 3 for generating additional magnetic fields having a gradient in the X, Y, Z directions. The Z direction of the co-ordinate system shown corresponds to the direction of the steady magnetic field in the magnet system 2 by convention. The measuring co-ordinate system x, y, z to be used can be chosen independently of the X, Y, Z system shown in FIG. 3. The gradient coils are fed by a power supply unit 4. An RF transmitter coil 5 serves to generate RF magnetic excitation pulses and is connected to an RF transmitter and modulator 6.

A receiver coil is used to receive the magnetic resonance signal generated by the RF field in the object 7 to be examined, for example a human or animal body. This coil may be the same coil as the RF transmitter coil 5. Furthermore, the magnet system 2 encloses an examination space which is large enough to accommodate a part of the body 7 to be examined. The RF coil 5 is arranged around or on the part of the body 7 to be examined in this examination space. The RF transmitter coil 5 is connected to a signal amplifier and demodulation unit 10 via a transmission/reception circuit 9.

The control unit 11 controls the RF transmitter and modulator 6 and the power supply unit 4 so as to generate special pulse sequences which contain RF pulses and gradients. The phase and amplitude obtained from the demodulation unit 10 are applied to a processing unit 12. The processing unit 12 processes the presented signal values (also referred to as k-space) so as to form an image by transformation. This image can be visualized, for example by means of a monitor 13.

Processing unit 12 determines a shift $\Delta f$ of the resonance frequency on the basis of the phase information obtained from the demodulation unit and provides the shift $\Delta f$ to the control unit 11 for compensation of the shift.

The acquisition of the required phase information is explained in more detail in the following by making reference to FIG. 2. First an RF magnetic excitation pulse 200 is generated by the transmitter coil (cf. transmitter coil 5 of FIG. 1). Further a slice selecting gradient $G_z$ pulse 202, a bipolar switched gradient 204, and a phase encoding gradient 206 are applied. The application of these gradients 202, 204 and 206 for single shot EPI magnetic resonance data acquisition is as such known from the prior art.

The single shot EPI provides measurement signal 208. The peak of measurement signal 208 is the echo time TE after the RF magnetic excitation pulse 200. The phase of measurement signal 208 at time TE with respect to the RF magnetic excitation pulse 200 is determined for the purpose of monitoring a drift of the magnetic field and a corresponding drift of the resonance frequency. In order to determine the resonance frequency drift, if any, the phase of the measurement signal 208 is determined again at a subsequent single shot EPI. The phase difference between the single shot EPIs enables to calculate the shift of the resonance frequency. This will be explained in greater detail by making reference to FIG. 3.

The phase information at time TE can be obtained from the measurement signal 208 in the time domain or in the frequency domain which requires to perform a Fourier transformation on measurement signal 208. The required phase information corresponds to a central line of the k-space which is usually referred to as $k_y=0$, i.e. a scan with frequency encoding but without phase encoding. The fact that there is no phase encoding enables to use drifts of the phase information obtained from the measurement signal 208 for determination of the resonance frequency shift.

Figure 3:
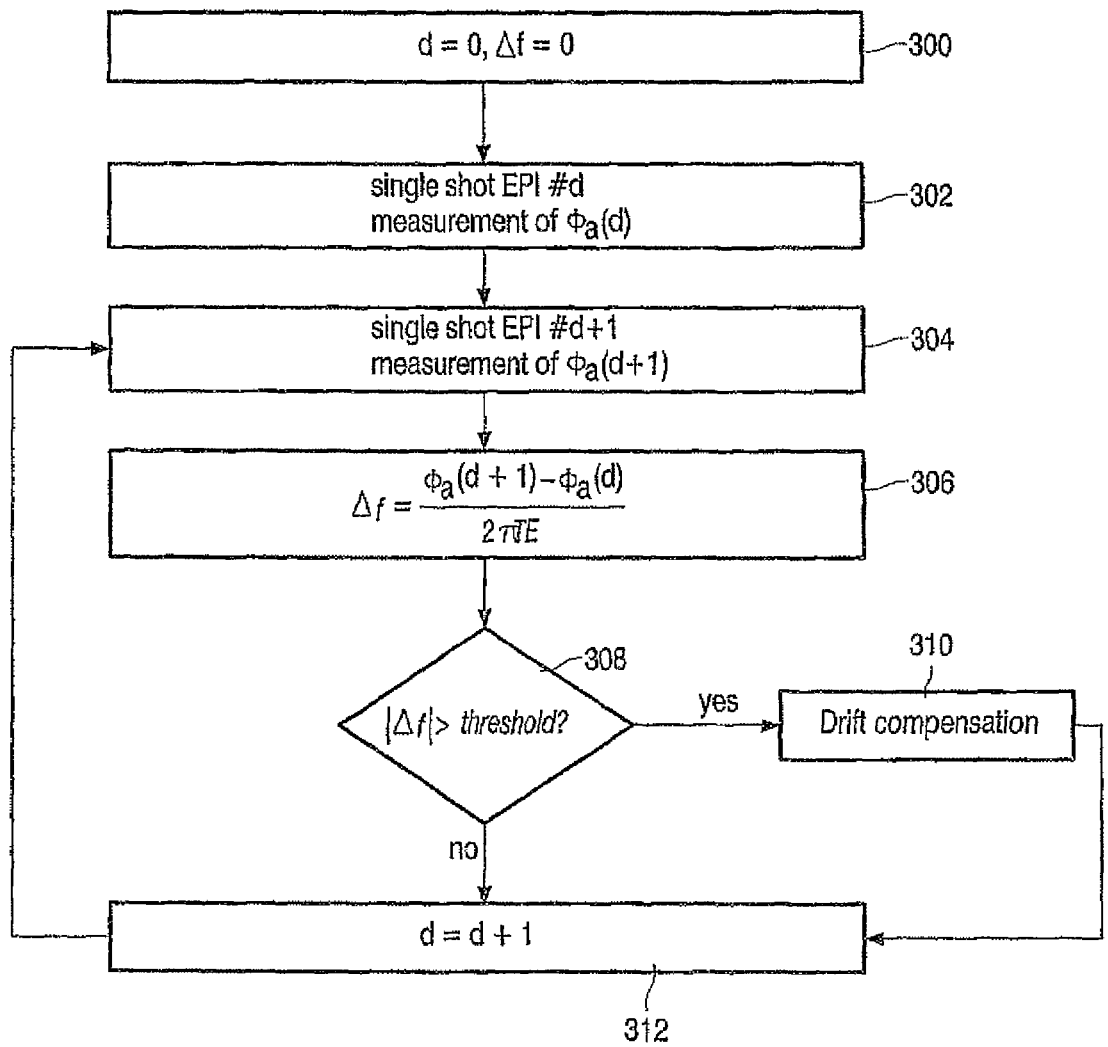
FIG. 3 is illustrative of a flow chart for monitoring and compensating the magnetic field drift in the case of single shot EPI.

FIG. 3 shows a flow chart for monitoring and compensating of a magnetic field drift in the case of single shot EPI. In step 300 the index d is set to zero. The shift of the resonance frequency $\Delta f$ is also set to zero in step 300.

Figure 2:
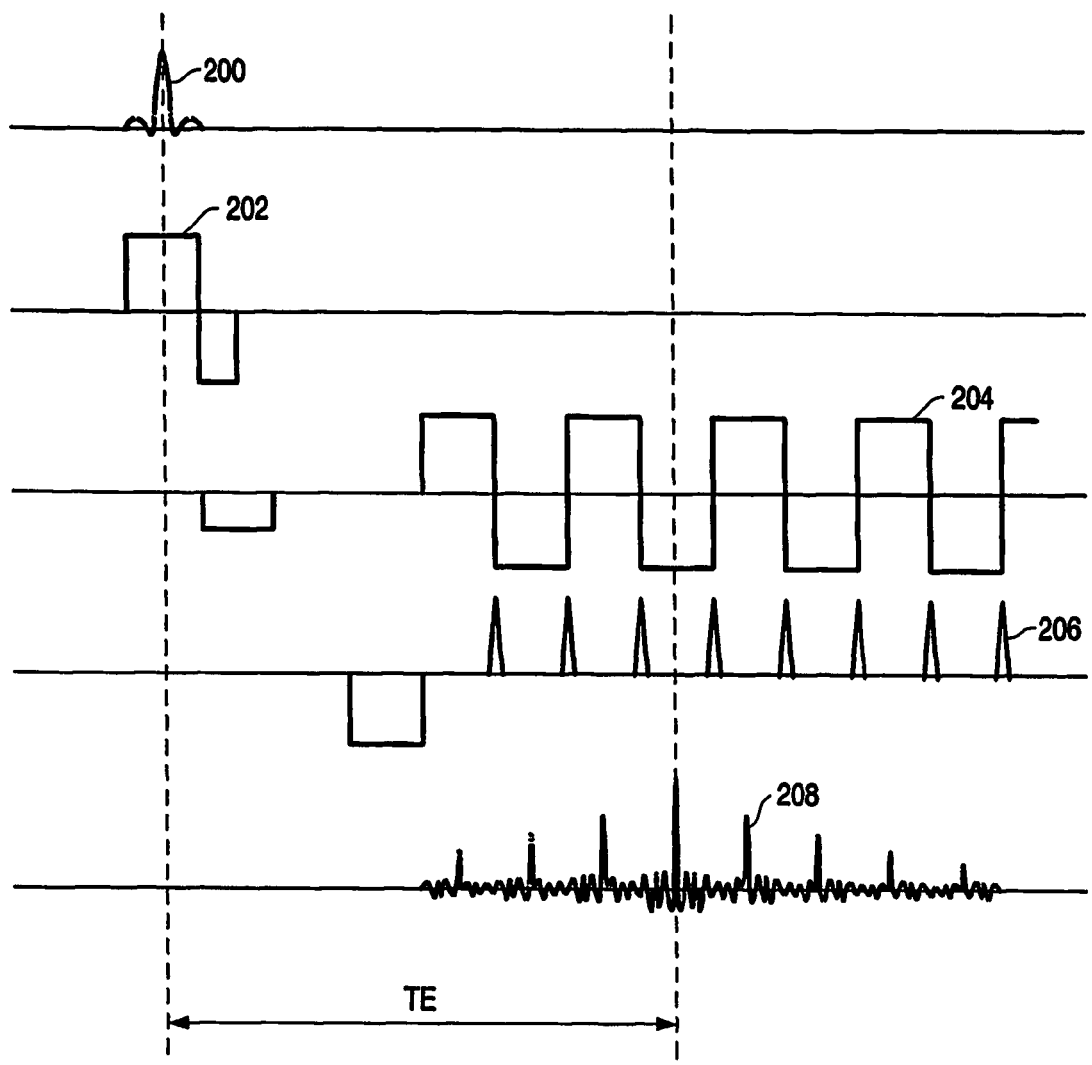
FIG. 2 is illustrative of the phase determination for a single shot EPI.

In step 302 the first single shot EPI is performed and the measurement of the phase $\phi_a(d)$ is performed as explained with respect to FIG. 2.

The time interval of TE after the first single shot EPI is performed in step 302 the second single shot EPI is performed in step 304. Again the phase $\phi_a$ is measured.

In step 306 a shift $\Delta f$ of the resonance frequency is calculated by calculating the difference between the phases $\phi_a$ which have been acquired in steps 302 and 304 and by dividing the difference by $2\pi\times$the time interval between the consecutive single shot EPIs. In this case this time interval is the echo time TE.

In step 308 the absolute value of the shift $\Delta f$ is compared to a threshold value. If the threshold value is surpassed a drift compensation is performed in step 310. Preferably this is done by adjusting the frequency of the RF magnetic excitation pulses to the shifted resonance frequency.

If the shift $\Delta f$ does not surpass the threshold no drift compensation is required. In step 312 the index d is incremented and the control goes back to step 304 for continuous monitoring the shift $\Delta f$.

Figure 4:
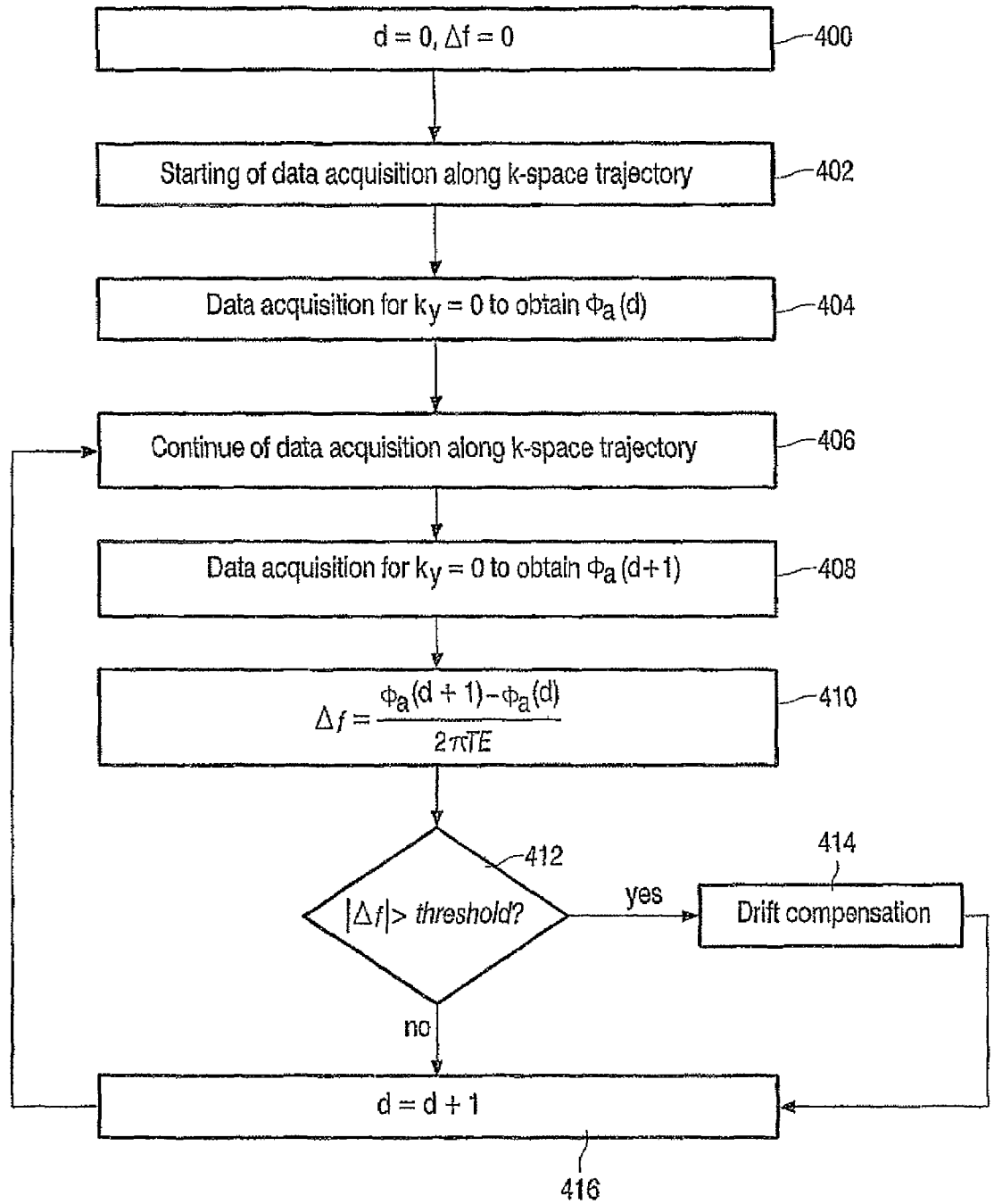
FIG. 4 is illustrative of a flow chart for magnetic field monitoring and compensation if a gradient echo sequence is employed.

FIG. 4 shows an alternative embodiment which uses a gradient echo sequence rather than single shot EPI. Step 400 corresponds to step 300 of FIG. 3. In step 402 the magnetic resonance data acquisition is started by starting to scan the k-space along a given trajectory. The trajectory may or may not cover the central line of the k space which is $k_y=0$.

In step 404 the scan of the k-space along the trajectory is interrupted in order to perform a data acquisition for the central k-space line with frequency encoding but no phase encoding, i.e. $k_y=0$. This way the phase information $\phi_a$ is obtained.

In step 406 the scan along the k-space trajectory is continued. After a certain time interval the scan along the k-space trajectory is interrupted again in order to perform another data acquisition for $k_y=0$ to obtain another phase information $\phi_a$.

In step 410 the shift of the resonance frequency is calculated by calculating the difference between the phases determined in steps 404 and 408 and by dividing the difference by $2\pi$ TE.

In step 412 the absolute value of the frequency shift $\Delta f$ is compared to a threshold value. If the threshold value is surpassed drift compensation is performed in step 414. In step 416 the index d is incremented and the control goes back to step 406 in order to continue the scan along the k-space trajectory. This procedure continues during the entire gradient echo sequence for continuously monitoring the shift of the resonance frequency and compensating the drift of the magnetic field if necessary.

The RF pulses of this modified gradient echo MRI sequence are applied at a single frequency (for a single slice); the phase measured at the echo (without encoding gradients) reflects only the phase difference accumulated between the RF pulse and the TE in case that the NMR resonant frequency (due to B0) is not equal to the excitation frequency (excluding susceptibility and chemical shift effects). When the magnet B0 is such that the NMR resonant frequency is the same as the excitation frequency of the RF pulse then the phase error accumulated between RF pulse and TE will be zero or constant from repetition to repetition.

When the B0 is such that it corresponds to a different resonant frequency than the one the RF pulse is exciting, then the phase error accumulated between RF pulse and TE will be a finite value (proportional to the difference and TE). At the peak of each RF pulse, all magnetization is in phase, irrespective of the B0. Only after this time does the B0 have an effect on the magnetization.

So, each RF pulse behaves like a phase reset (as far as the F0 measurement process is concerned). The relative phase error (relative to zero at the RF pulse peak) at the TE increases as B0 moves further from the RF excitation frequency. Other mechanisms (chemical shift, susceptibility) can contribute to the phase error measured at the TE. Assuming that these other contributors to phase error are constant from repetition to repetition, the change in B0 can be determined by calculating the difference in phase errors between data acquired from two different repetitions.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A method of correcting magnetic field drift in a magnetic resonance imaging apparatus, the method comprising:

performing a first single shot EPI sequence in which a first excitation induces a following first magnetic resonance signal including a series of echoes with each of a series of different phase encodings including one of the echoes with zero phase encoding, the zero phase-encoded echo being timed to occur at a preselected time interval after the first excitation;

determining a first phase of the first magnetic resonance signal at the preselected time interval after the first excitation;

performing a second single shot EPI sequence in which a second excitation pulse induces a following second magnetic resonance signal including a series of magnetic resonance echoes with a series of different phase encoding, one of them with a zero phase encoding, the zero phase-encoded echo being timed to occur at said preselected time interval after the second excitation;

determining a second phase of the second magnetic resonance signal at said preselected time interval after the second excitation;

determining a difference between the first and second determined phases;

from the determined phase difference, determining at least one of an adjustment to a frequency for excitation in a subsequent single shot EPI sequence and a magnitude of a main magnetic field adjustment.

2. The method of claim 1, wherein the method further includes:

comparing the difference between the first and second determined phases with a threshold and causing the resonance frequency or the main magnetic field to be adjusted if the difference between the first and second determined phases exceeds the threshold.

3. The method of claim 1, wherein determining the first and second phases includes:

sampling the first magnetic resonance signal at said preselected time interval;

sampling the second magnetic resonance signal at said preselected time interval;

Fourier transforming the sampled first and second magnetic resonance signals to the frequency domain such that the difference between the first and second phases is determined in the frequency domain.

4. A computer readable storage medium having stored thereon a computer program including instructions which, when executed by a computer, cause the computer to perform the method of claim 1.

5. A method of monitoring magnetic field drift in a magnetic resonance imaging apparatus, the method comprising:

performing a first gradient echo sequence in which a first excitation is followed by a series of magnetic resonance echoes with a series of phase encoding, a magnetic resonance echo at a preselected time interval after the first excitation being given zero phase encoding;

determining a first phase of a first magnetic resonance signal induced by the first excitation at the preselected time interval after the first excitation during the echo given zero phase encoding;

performing a second gradient echo data sequence in which a second excitation pulse is applied followed by a series of magnetic resonance echoes, a magnetic resonance echo at the preselected time interval after the second excitation being given zero phase encoding;

determining a second phase of a second magnetic resonance signal induced by the second excitation at the preselected time interval after the second excitation during the echo given zero phase encoding;

comparing the first and second determined phases;

determining a shift in a resonance of a resonance frequency based on the comparing of the first and second phases.

6. The method according to claim 5, further including:

comparing a difference between the first and second determined phases with a threshold;

if the difference exceeds the threshold, adjusting at least one of an excitation frequency and a magnitude of a main magnetic field.

7. The method of claim 5, wherein determining the first and second phases includes:

sampling the first magnetic resonance signal at said preselected time interval;

sampling the second magnetic resonance signal at said preselected time interval;

Fourier transforming the sampled first and second magnetic resonance signals to the frequency domain such that the step of comparing the first and second phases is performed in the frequency domain.

8. The method of claim 5, further including:

determining a plurality of first phases at a plurality of preselected time intervals after the first excitation; and determining a plurality of the second phases at the same preselected time intervals after the second excitation.

9. A computer readable medium having thereon a computer program including instructions which, when executed by a processor, cause the processor to perform the method of claim 5.

10. A magnetic resonance imaging apparatus including at least one processor programmed to perform the method of claim 5.

11. The magnetic resonance imaging apparatus of claim 10, further including a display which displays the determined shift of the resonance frequency.

12. The magnetic resonance imaging apparatus of claim 10, further including:

a controller which controls the excitations in accordance with the determined shift of the resonance frequency.

13. The magnetic resonance imaging apparatus of claim 10, further including:

a controller for controlling a magnitude of the magnetic field in accordance with the determined shift of the resonance frequency.

14. A computer readable storage medium having stored thereon a computer program including instructions which, when executed by a computer of a magnetic resonance system, causes:

performing a first single shot magnetic resonance sequence in which a first excitation pulse is followed by a first magnetic resonance signal including a series of echoes, an echo with zero induced phase encoding is caused to occur at a selected time interval after the first excitation;

determining a first phase of the first magnetic resonance signal during the echo with zero induced phase encoding at the selected time interval after the first excitation;

performing a second single shot magnetic resonance sequence in which a second excitation pulse is applied followed by a second magnetic field including a series of magnetic resonance echoes, an echo with zero induced phase encoding is caused to occur at the selected time interval after the second excitation such that both the first and second magnetic resonance signals have echoes with zero induced phase encoding the same selected time after the corresponding excitation pulse;

determining a second phase of the second magnetic during the echo with zero induced phase encoding at the selected time interval after the second excitation;

determining a difference between the first and second determined phases;

determining a shift of a resonance of a resonance frequency based on determined differences between the first and second phases.

15. The medium of claim 14, wherein when the instructions are executed by the computer, they further cause:

at least one of an excitation frequency and a main magnetic field strength to be adjusted followed by performing another single shot sequence.

* * * * *